（12） United States Patent
Hu et al.

(10) Patent No.: US 11,074,986 B2
(45) Date of Patent: Jul. 27, 2021

(54) SHIFT REGISTER, GATE DRIVING CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Shenghua Hu, Beijing (CN); Chunyang Nie, Beijing (CN); Lixin Zhu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/835,845

(22) Filed: Mar. 31, 2020

(65) Prior Publication Data

US 2021/0035651 A1 Feb. 4, 2021

(30) Foreign Application Priority Data

Jul. 29, 2019 (CN) .......................... 201910688713.4

(51) Int. Cl.
*G11C 19/28* (2006.01)
*G09G 3/20* (2006.01)

(52) U.S. Cl.
CPC ........... *G11C 19/28* (2013.01); *G09G 3/2092* (2013.01); *G09G 2300/0842* (2013.01); *G09G 2310/0286* (2013.01)

(58) Field of Classification Search
CPC ......... G09G 2310/0286; G09G 3/2092; G09G 2300/0842; G11C 19/28
See application file for complete search history.

(56) References Cited

U.S. PATENT DOCUMENTS

| 2012/0293737 A1* | 11/2012 | Li | G11C 19/184 |
| | | | 349/42 |
| 2013/0136224 A1* | 5/2013 | Qing | H03K 3/0375 |
| | | | 377/64 |
| 2016/0189795 A1* | 6/2016 | Chen | G11C 19/287 |
| | | | 377/70 |

* cited by examiner

*Primary Examiner* — Xuemei Zheng
(74) *Attorney, Agent, or Firm* — Calfee, Halter & Griswold LLP

(57) ABSTRACT

A shift register includes: a first signal output terminal; a first switching, configured to transmit a signal of a first DC power signal terminal to a first node in response to the signal of the first DC power signal terminal; a second switching, configured to transmit a signal of a second DC power signal terminal to the first node in response to a signal of the first signal output terminal; a third switching, configured to transmit the signal of the second DC power signal terminal to a second signal output terminal in response to a signal of the first node; and a fourth switching, configured to transmit the signal of the first DC power signal terminal to the second signal output terminal in response to the signal of the first DC power signal terminal.

14 Claims, 4 Drawing Sheets

SHIFT REGISTER, GATE DRIVING CIRCUIT, AND DISPLAY DEVICE

CROSS-REFERENCE TO RELATED APPLICATIONS

This application is based upon and claims priority to Chinese Patent Application No. 201910688713.4, filed Jul. 29, 2019, the entire contents of which are incorporated herein by reference.

TECHNICAL FIELD

The present disclosure relates to the field of display technology, and more particularly, to a shift register, a gate driving circuit, and a display device.

BACKGROUND

In the field of display technology, a gate driving circuit is generally used to send gate driving signals to pixel units of a display area line by line, so that the pixel units receive data signals line by line. The gate driving circuit generally includes multi-stage connected shift register, and an output terminal of each shift register is connected to a row of pixel units, and is configured to send the above gate driving signals to the pixel units.

SUMMARY

The purpose of the present disclosure is to provide a shift register, a gate driving circuit, and a display device.

Other features and advantages of the disclosure will become apparent from the following detailed description, or may be learned in part through the practice of the disclosure.

According to an aspect of the present disclosure, there is provided a shift register including a first signal output terminal, wherein the shift register further includes: a first switching, a second switching, a third switching, and a fourth switching. The first switching is connected to a first DC power signal terminal and a first node, and is configured to transmit a signal of the first DC power signal terminal to the first node in response to the signal of the first DC power signal terminal; the second switching is connected to a second DC power signal terminal, the first signal output terminal, and the first node, and is configured to transmit a signal of the second DC power signal terminal to the first node in response to a signal of the first signal output terminal; the third switching is connected to the first node, the second DC power signal terminal, and a second signal output terminal, and is configured to transmit the signal of the second DC power signal terminal to the second signal output terminal in response to a signal of the first node; and the fourth switching is connected to the first DC power signal terminal and the second signal output terminal, and is configured to transmit the signal of the first DC power signal terminal to the second signal output terminal in response to the signal of the first DC power signal terminal.

According to an aspect of the present disclosure, there is provided a gate driving circuit including the above shift register.

According to an aspect of the present disclosure, there is provided a display device including the above gate driving circuit.

It is to be understood that both the foregoing general description and the following detailed description are exemplary and explanatory only and are not restrictive of the present disclosure.

BRIEF DESCRIPTION OF THE DRAWINGS

The drawings herein, which are incorporated in and constitute a part of the specification, illustrate embodiments consistent with the present disclosure, and serve to explain the principles of the present disclosure together with the description. Obviously, the drawings in the following description are just some embodiments of the present disclosure. For those of ordinary skill in the art, other drawings may be obtained according to these drawings without creative efforts.

DETAILED DESCRIPTION

Figure 1:
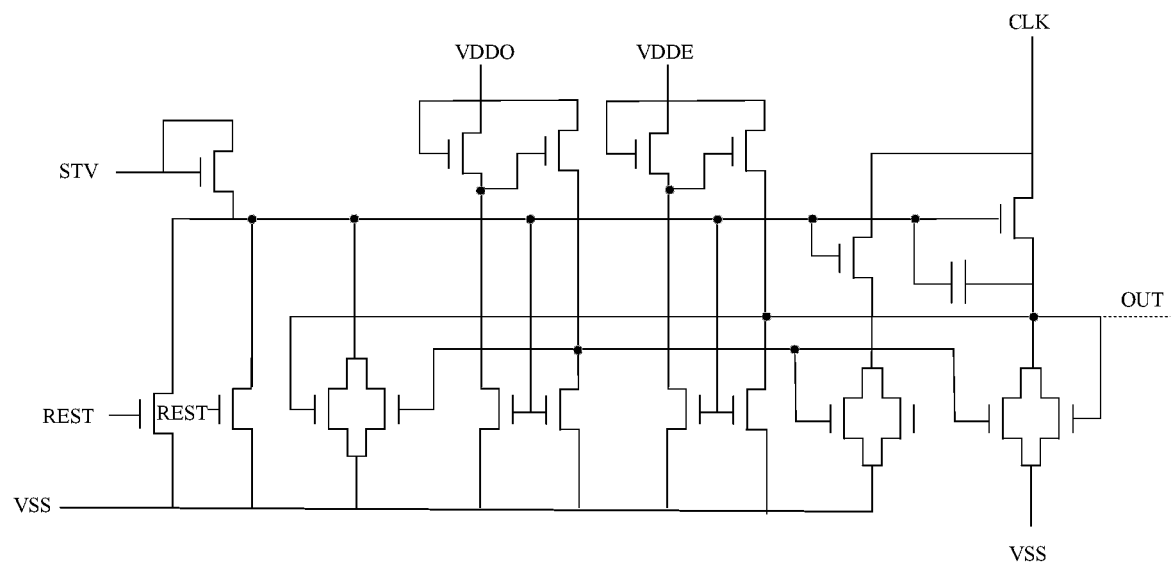
FIG. 1 is a schematic structural view of a shift register in the related art.

Example embodiments will now be described more fully with reference to the accompanying drawings. However, the example embodiments can be implemented in various forms and should not be construed as limited to the examples set forth herein; rather, these embodiments are provided to make the present disclosure more comprehensive and complete, and fully conveys the concepts of the example embodiments to those skilled in the art. The same reference numerals in the drawings denote the same or similar structures, and thus their detailed descriptions will be omitted.

Although relative terms such as "on" and "under" are used in this specification to describe the relative relationship between one component and another component of the icon, these terms are used in this specification for convenience only, for example, according to the illustrative direction depicted in the drawings. It can be understood that if the device of the icon is inversed and turned upside down, the component described "on" would become the component "below". Other relative terms, such as "high", "low", "top", "bottom", "left" and "right", have similar meanings. When a certain structure is "on" other structure(s), it may mean that the certain structure is integrally formed on the other structure(s), or that the certain structure is "directly" arranged on the other structure(s), or that the certain structure is "indirectly" arranged on other structure(s) through another structure.

The terms "a", "an", and "the" are used to indicate the presence of one or more elements/components/etc.; the terms "comprising" and "including" are used to indicate open-ended inclusive means, and means that there may be additional elements/components/etc., in addition to the listed elements/components/etc.

In the related art, the shift register generally provides an output signal to its output terminal through a clock signal terminal, and the output signal is the gate driving signal.

However, in the related art, the widths of rising and falling edges of the gate driving signal are relatively long, which affects the charging time of the pixels in a display device, especially in a high-resolution display device, and this technical problem may seriously affect the display effect of the display device.

The present disclosure is directed to provide a shift register, a gate driving circuit, and a display device, which are used to solve the technical problems in the related art that the widths of the rising and falling edges of the gate driving signal are relatively long, which affects the charging time of the pixels.

As shown in FIG. 1, which is a schematic structural view of a shift register in the related art, in the shift register, a signal of a clock signal terminal CLK is a clock pulse signal, and the clock signal terminal CKL outputs a pulse signal of an active level when an output terminal OUT needs to output a valid driving signal. However, since the signal of the clock signal terminal CLK itself has rising and falling edges, the rising and falling edges of a gate driving signal output from the output terminal OUT are relatively long.

Figure 2:
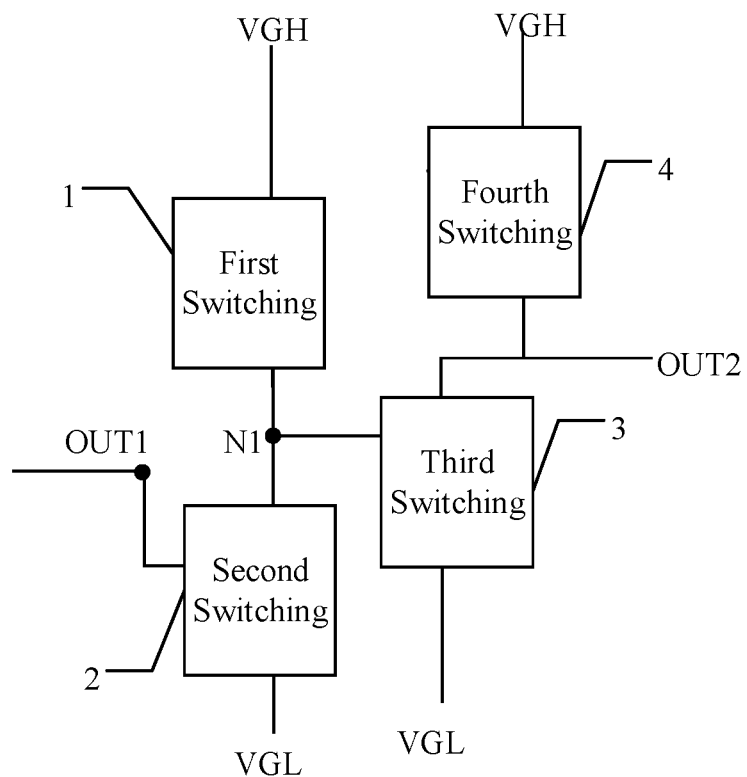
FIG. 2 is a schematic structural view of an exemplary embodiment of a shift register according to the present disclosure.

Based on this, the present disclosure provides a shift register, as shown in FIG. 2, which is a schematic structural view of an exemplary embodiment of a shift register according to the present disclosure. The shift register includes a first signal output terminal OUT1, and the shift register further includes: a first switching 1, a second switching 2, a third switching 3, and a fourth switching 4. The first switching 1 is connected to a first DC power signal terminal VGH and a first node N1, and is configured to transmit a signal of the first DC power signal terminal VGH to the first node N1 in response to the signal of the first DC power signal terminal VGH; the second switching 2 is connected to a second DC power signal terminal VGL, the first signal output terminal OUT1, and the first node N1, and is configured to transmit a signal of the second DC power signal terminal VGL to the first node N1 in response to a signal of the first signal output terminal OUT1; the third switching 3 is connected to the first node N1, the second DC power signal terminal VGL, and a second signal output terminal OUT2, and is configured to transmit the signal of the second DC power signal terminal VGL to the second signal output terminal OUT2 in response to a signal of the first node N1; and the fourth switching 4 is connected to the first DC power signal terminal VGH and the second signal output terminal OUT2, and is configured to transmit the signal of the first DC power signal terminal VGH to the second signal output terminal OUT2 in response to the signal of the first DC power signal terminal VGH.

As shown in FIG. 2, the signal of the first DC power signal terminal is an active level signal, and the signal of the second DC power signal terminal is an in inactive level signal. When the first signal output terminal OUT1 outputs the active level signal, the second switching is turned on to transmit the inactive level signal of the second DC power signal terminal to the first node N1. At this time, the fourth switching 4 is turned on under the active level signal of the first DC power signal terminal, so as to transmit the active level signal of the first DC power signal terminal to the second signal output terminal OUT2. When the first signal output terminal OUT1 outputs the invalid level signal, the second switching is turned off, and the first switching is turned on under the active level signal of the first DC power signal terminal, so as to transmit the active level signal of the first DC power signal terminal to the first node N1, and the third switching 3 is turned on under the active level signal of the first node N1 to transmit the invalid level signal of the second DC power signal terminal to the second signal output terminal OUT2.

On one hand, the present disclosure uses the signal of the first signal output terminal as the control signal of the second switching. Because the ON potential of the second switching is relatively low and the second switching has been turned on when the signal of the first signal output terminal is still in the rising edge and falling edge phases, the signal of the first DC power signal terminal may be used to resend the gate driving signal to the second signal output terminal, so as to reduce the widths of the rising edge and falling edge of the gate driving signal. On the other hand, when the first signal output terminal outputs an inactive level signal, the third switching is turned on by the signal of the first DC power signal terminal, so that the second signal output terminal is in communication with the second DC power signal terminal, thereby avoiding the leakage current from the first DC power signal terminal to the second signal output terminal from affecting the potential of the second signal output terminal.

Wherein the first to fourth switching may be switching transistors. When the active level is high, the first to fourth switching may be N-type transistors; when the active level is low, the first to fourth switching may be P-type transistors.

Figure 3:
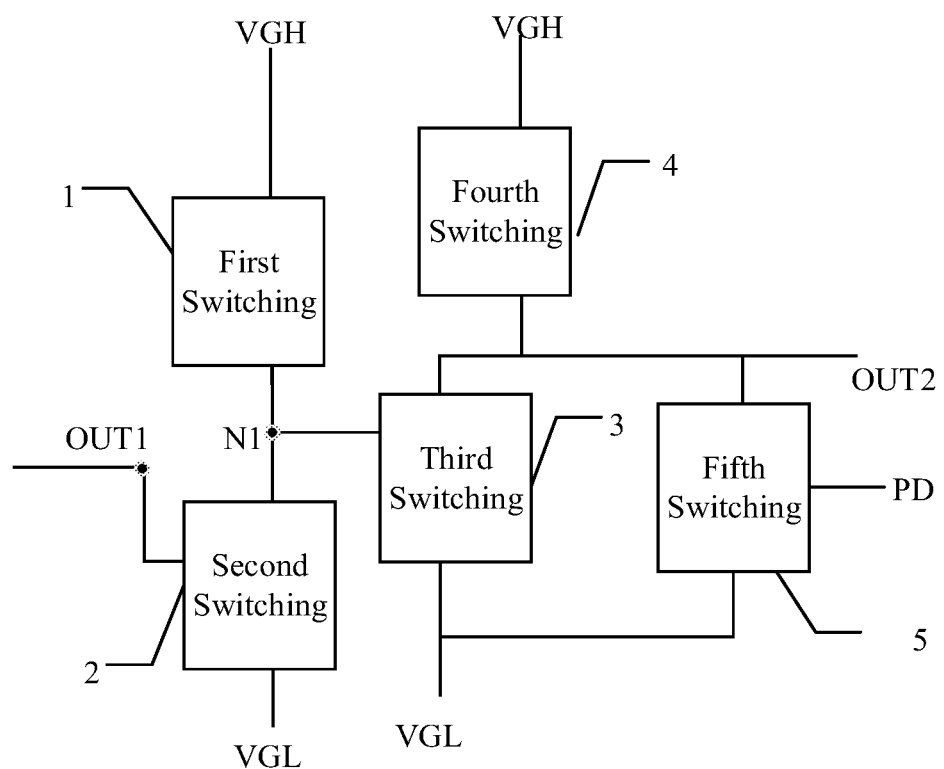
FIG. 3 is a schematic structural view of another exemplary embodiment of a shift register according to the present disclosure.

As shown in FIG. 3, which is a schematic structural view of another exemplary embodiment of a shift register according to the present disclosure, in the exemplary embodiment, the shift register further includes a pull-down node PD, and the shift register further includes a fifth switching 5, which is connected to the second DC power signal terminal VGL, the second signal output terminal OUT2, and the pull-down node PD, and is configured to transmit the signal of the second DC power signal terminal VGL to the second signal output terminal OUT2 in response to a signal of the pull-down node PD. Wherein when the pull-down node PD of the shift register outputs the active level, the first signal output terminal OUT1 should output the inactive level. By disposing the fifth switching 5, it is possible to prevent the second signal output terminal OUT2 from abnormally outputting the active level signal.

Figure 4:
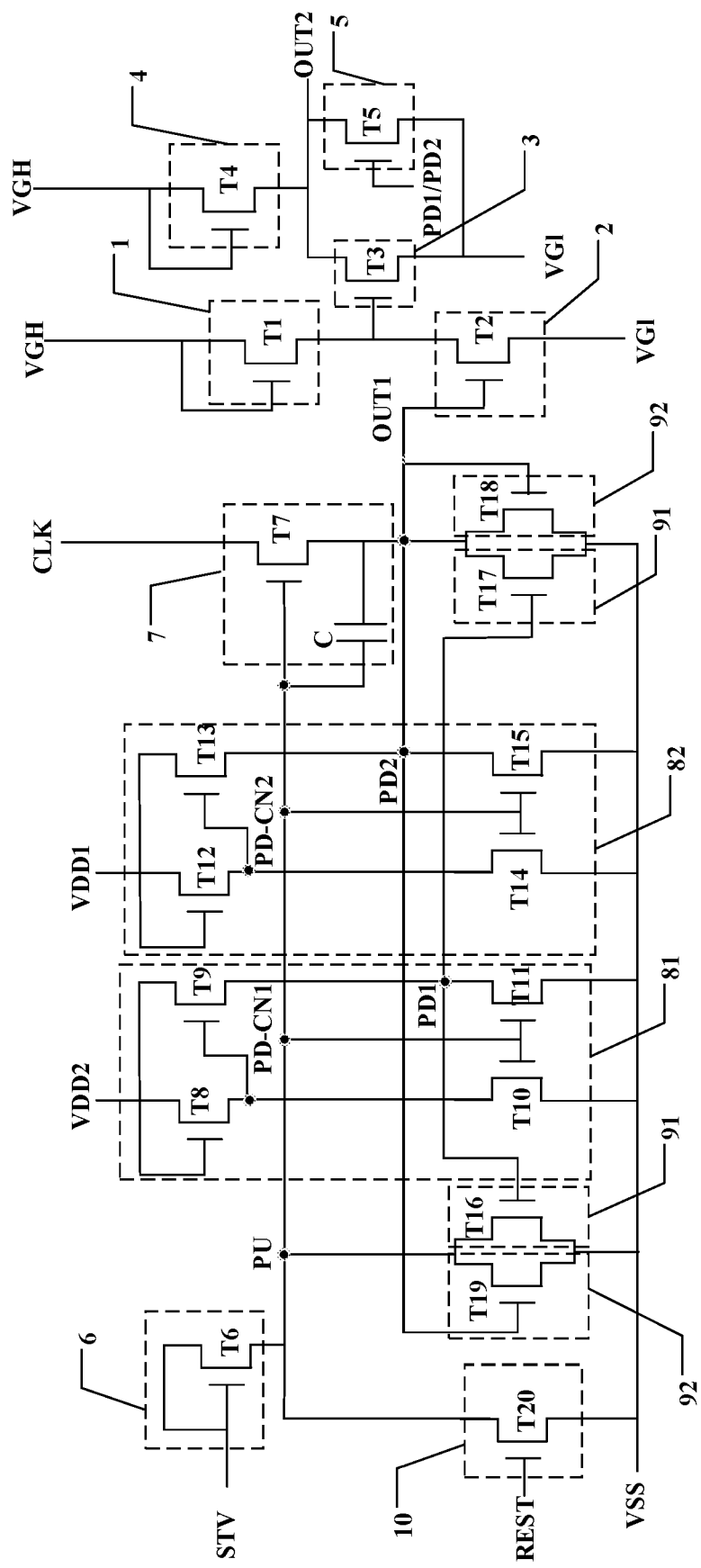
FIG. 4 is a schematic structural view of another exemplary embodiment of a shift register according to the present disclosure.

As shown in FIG. 4, which is a schematic structural view of another exemplary embodiment of a shift register according to the present disclosure, in the exemplary embodiment, the pull-down node may include a first pull-down node PD1 and a second pull-down node PD2. The shift register may further include: an input circuit 6, an output circuit 7, a pull-down control circuit, a first pull-down circuit 91, a second pull-down circuit 92, and a reset circuit 10. The input circuit 6 is connected to an input signal terminal STV and a pull-up node PU, and is configured to transmit a signal of the input signal terminal STV to the pull-up node PU in response to the signal of the input signal terminal STV; the output circuit 7 is connected to a clock signal terminal CLK, the first signal output terminal OUT1, and the pull-up node PU, and is configured to transmit the signal of the clock signal terminal CLK to the first signal output terminal OUT1 in response to a signal of the pull-up node PU; the pull-down control circuit is connected to a third power signal terminal VDD2, a fourth power signal terminal VDD1, a fifth power signal terminal VSS, the pull-up node PU, the first pull-down node PD1, and the second pull-down node PD2, and is configured to transmit a signal of the fifth power signal terminal VSS to the first pull-down node PD1 and the second pull-down node PD2 in response to the signal of the pull-up node PU, and transmit a signal of the third power signal terminal VDD2 to the first pull-down node PD1 and transmit the signal of the fourth power signal terminal VDD1 to the second pull-down node PD2 in response to signals of the third power signal terminal VDD2 and the fourth power signal terminal VDD1 alternately; the first pull-down circuit 91 is connected to the first pull-down node PD1, the fifth power signal terminal VSS, the first signal output terminal OUT1, and the pull-up node PU, and is configured to transmit the signal of the fifth power signal terminal VSS to the pull-up node PU and the first signal output terminal OUT1 in response to a signal of the first pull-down node PD1; the second pull-down circuit 92 is connected to the second pull-down node PD2, the fifth power signal terminal VSS, the first signal output terminal OUT1, and the pull-up node PU, and is configured to transmit the signal of the fifth power signal terminal VSS to the pull-up node PU and the first signal output terminal OUT1 in response to a signal of the second pull-down node PD2; the reset circuit 10 is connected to a reset signal terminal REST, the pull-up node PU, and the fifth power signal terminal VSS, and is configured to transmit the signal of the fifth power signal terminal VSS to the pull-up node PU in response to a signal of the reset signal terminal REST; wherein a control terminal of the fifth switching is connected to the first pull-down node PD1 or the second pull-down node PD2.

Wherein the signal of the fifth power signal terminal VSS is an inactive level signal, the signals of the third power signal terminal VDD2 and the fourth power signal terminal VDD1 are alternately active level signals. Such an arrangement may avoid the technical problem of the transistor threshold drift in the pull-down control circuit and the pull-down circuit.

In an exemplary embodiment, the pull-down control circuit may include a first pull-down control circuit 81 and a second pull-down control circuit 82. The first pull-down control circuit 81 is connected to the third power signal terminal VDD2, the fifth power signal terminal VSS, a first pull-down control node PD-CN1, the first pull-down node PD1, and the pull-up node PU, and is configured to transmit the signal of the fifth power signal terminal VSS to the first pull-down node PD1 and the first pull-down control node PD-CN1 in response to the signal of the pull-up node PU, and transmit the signal of the third power signal terminal VDD2 to the first pull-down node PD1 and the first pull-down control node PD-CN1 in response to the signal of the third power signal terminal VDD2; and the second pull-down control circuit 82 is connected to the fourth power signal terminal VDD1, the fifth power signal terminal VSS, a second pull-down control node PD-CN2, the second pull-down node PD2, and the pull-up node PU, and is configured to transmit the signal of the fifth power signal terminal VSS to the second pull-down node PD2 and the second pull-down control node PD-CN2 in response to the signal of the pull-up node PU, and transmit the signal of the fourth power signal terminal VDD1 to the second pull-down node PD2 and the second pull-down control node PD-CN2 in response to the signal of the fourth power signal terminal VDD1.

In the exemplary embodiment, as shown in FIG. 4, the first switching 1 may include a first transistor T1, a first terminal of the first transistor T1 is connected to the first DC power signal terminal VGH, a second terminal thereof is connected to the first node N1, and a control terminal thereof is connected to the first DC power signal terminal VGH; the second switching 2 may include a second transistor T2, a first terminal of the second transistor T2 is connected to the second DC power signal terminal VGL, a second terminal thereof is connected to the first node N1, and a control terminal thereof is connected to the first signal output terminal OUT1; the third switching 3 may include a third transistor T3, and a first terminal of the third transistor T3 is connected to the second DC power signal terminal VGL, a second terminal thereof is connected to the second signal output terminal OUT2, and a control terminal thereof is connected to the first node N1; the fourth switching 4 may include a fourth transistor T4, a first terminal of the fourth transistor T4 is connected to the first DC power signal terminal VGH, and a second terminal thereof is connected to the second signal output terminal OUT2, and a control terminal thereof is connected to the first DC power signal terminal; and the fifth switching 5 may include a fifth transistor T5, a first terminal of the fifth transistor T5 is connected to the second DC power signal terminal VGL, a second terminal thereof is connected to the second signal output terminal OUT2, and a control terminal thereof is connected to the pull-down node.

In an exemplary embodiment of the present disclosure, the input circuit 6 may include a sixth transistor T6, a first terminal of the sixth transistor T6 is connected to the input signal terminal STV, and a second terminal thereof is connected to the pull-up node PU, and a control terminal thereof is connected to the input signal terminal STV; and the output circuit 7 may include a seventh transistor T7 and a capacitor C, a first terminal of the seventh transistor T7 is connected to the clock signal terminal CLK, and a second terminal thereof is connected to the first signal output terminal OUT1, and a control terminal thereof is connected to the pull-up node PU; and the capacitor C is connected between the pull-up node PU and the first signal output terminal OUT1.

In an exemplary embodiment, the first pull-down control circuit 81 may include an eighth transistor T8, a ninth transistor T9, a tenth transistor T10, and an eleventh transistor T11. A first terminal of the eighth transistor T8 is connected to the third power signal terminal VDD2, a control terminal thereof is connected to the third power signal terminal VDD2, and a second terminal thereof is connected to the first pull-down control node PD-CN1; a first terminal of the ninth transistor T9 is connected to the third power signal terminal VDD2, a control terminal thereof is connected to the first pull-down control node PD-CN1, and a second terminal thereof is connected to the first pull-down node PD1; a first terminal of the tenth transistor T10 is connected to the first pull-down control node PD-CN1, a second terminal thereof is connected to the fifth power signal terminal VSS, and a control terminal thereof is connected to the pull-up node PU; and a first terminal of the eleventh transistor T11 is connected to the first pull-down node PD1, a second terminal thereof is connected to the fifth power signal terminal VSS, and a control terminal thereof is connected to the pull-up node PU; and the second pull-down control circuit 82 may include a twelfth transistor T12, a thirteenth transistor T13, a fourteenth transistor T14, and a fifteenth transistor T15. A first terminal of the twelfth transistor T12 is connected to the fourth power signal terminal VDD1, a second terminal thereof is connected to the second pull-down control node PD-CN2, and a control terminal thereof is connected to the fourth power signal terminal VDD1; a first terminal of the thirteenth transistor T13 is connected to the fourth power signal terminal VDD1, a second terminal thereof is connected to the second pull-down node PD2, and a control terminal thereof is connected to the second pull-down control node PD-CN2; a first terminal of the fourteenth transistor T14 is connected to the first pull-down control node PD-CN1, a second terminal thereof is connected to the fifth power signal terminal VSS, and a control terminal thereof is connected to the pull-up node PU; and a first terminal of the fifteenth transistor T15 is connected to the second pull-down node PD2, a second terminal thereof is connected to the fifth power signal terminal VSS, and a control terminal thereof is connected to the pull-up node PU.

In the exemplary embodiment, the first pull-down circuit 91 may include: a sixteenth transistor T16 and a seventeenth transistor T17. A first terminal of the sixteenth transistor T16 is connected to the fifth power signal terminal VSS, a second terminal thereof is connected to the pull-up node PU, and a control terminal thereof is connected to the first pull-down node PD1; and a first terminal of the seventeenth transistor T17 is connected to the fifth power signal terminal VSS, and a second terminal thereof is connected to the first signal output terminal OUT1, and a control terminal thereof is connected to the first pull-down node PD1. The second pull-down circuit 92 may include an eighteenth transistor T18 and a nineteenth transistor T19. A first terminal of the eighteenth transistor T18 is connected to the fifth power signal terminal VSS, a second terminal thereof is connected to the pull-up node PU, and a control terminal thereof is connected to the second pull-down node PD2; and a first terminal of the nineteenth transistor T19 is connected to the fifth power signal terminal VSS, a second terminal thereof is connected to the first signal output terminal OUT1, and a control terminal thereof is connected to the second pull-down node PD2. The reset circuit 10 may include a twentieth transistor T20, a first terminal of the twentieth transistor T20 is connected to the fifth power signal terminal VSS, a second terminal thereof is connected to the pull-up node PU, and a control terminal thereof is connected to the reset signal terminal REST.

Figure 5:
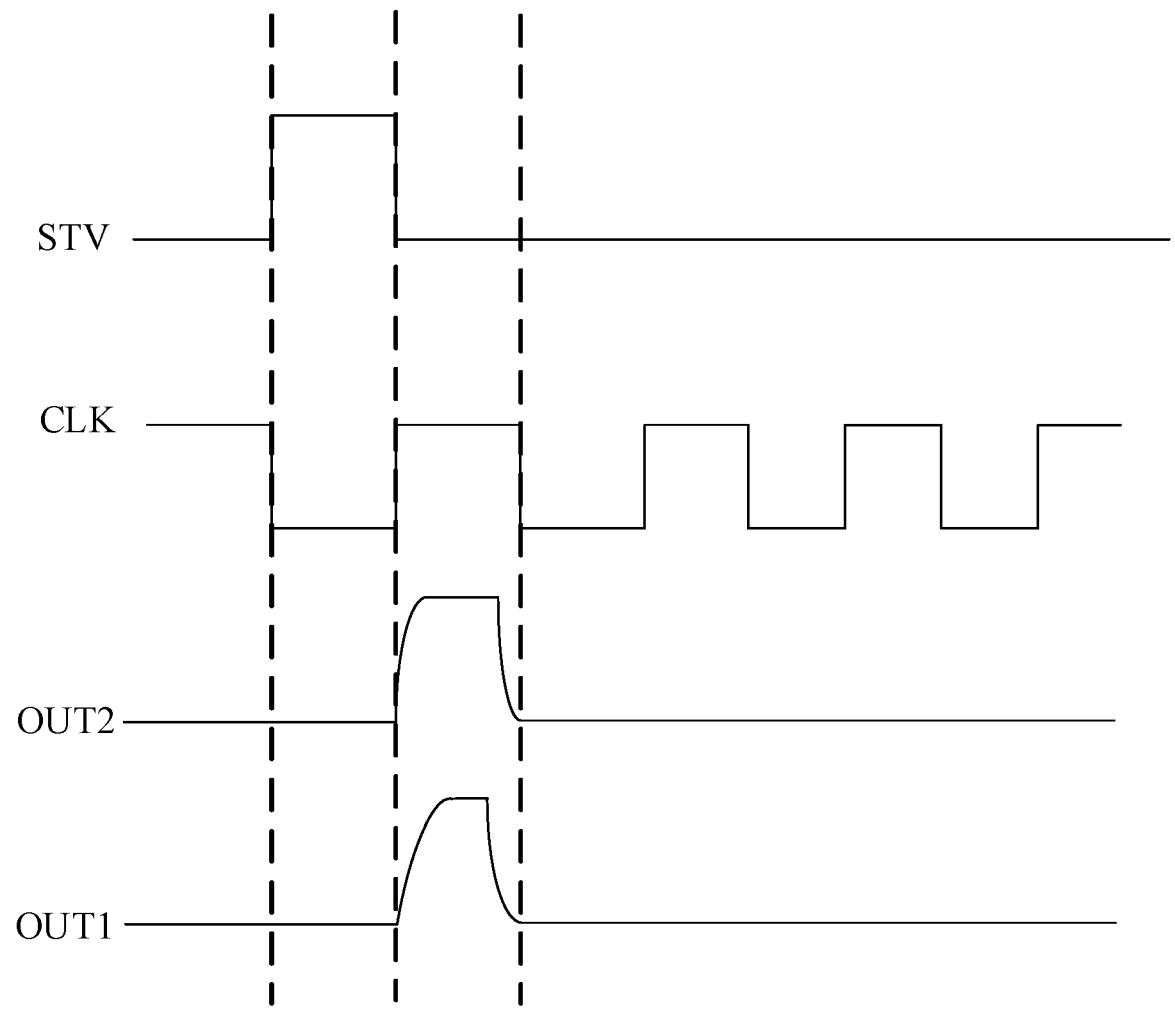
FIG. 5 is a timing diagram of each node in FIG. 4.

As shown in FIG. 5, which is a timing diagram of each node in FIG. 4, it can be seen from FIG. 5 that the rising and falling edges of the gate driving signal output from the first signal output terminal OUT1 are significantly wider than those of the gate driving signal output from the second signal output terminal OUT2.

It should be understood that, in other exemplary embodiments, the structure of the shift register for generating the gate driving signal to the first signal output terminal OUT has more options, and these all fall within the scope of the present disclosure.

The present exemplary embodiment further provides a gate driving circuit including the above shift register.

The gate driving circuit has the same technical features and working principle as the above shift register. The above contents have been described in detail, and are not repeated here.

The present exemplary embodiment further provides a display device including the above gate driving circuit.

The display device has the same technical features and working principle as the above gate driving circuit. The above contents have been described in detail, and are not repeated here.

Those skilled in the art will readily contemplate other embodiments of the present disclosure after considering the specification and practicing the disclosure disclosed herein. This application is intended to cover any variations, uses, or adaptations of the disclosure that conform to the general principles of this disclosure and include the common general knowledge or conventional technical means in the technical field not disclosed by the disclosure. It is intended that the specification and embodiments be considered as exemplary only, with a true scope and spirit of the disclosure being indicated by the claims.

It should be understood that the present disclosure is not limited to the precise structure that has been described above and illustrated in the accompanying drawings, and various modifications and changes may be made without departing from the scope thereof. The scope of the disclosure is limited only by the appending claims.

What is claimed is:
1. A shift register, comprising:
a first signal output terminal;
a first switching, connected to a first DC power signal terminal and a first node, and transmitting a signal of the first DC power signal terminal to the first node in response to the signal of the first DC power signal terminal;
a second switching, connected to a second DC power signal terminal, the first signal output terminal, and the first node, and transmitting a signal of the second DC power signal terminal to the first node in response to a signal of the first signal output terminal;
a third switching, connected to the first node, the second DC power signal terminal, and a second signal output terminal, and transmitting the signal of the second DC power signal terminal to the second signal output terminal in response to a signal of the first node;
a fourth switching, connected to the first DC power signal terminal and the second signal output terminal, and transmitting the signal of the first DC power signal terminal to the second signal output terminal in response to the signal of the first DC power signal terminal;
a pull-down node; and
a fifth switching, connected to the second DC power signal terminal, the second signal output terminal, and the pull-down node, and transmitting the signal of the second DC power signal terminal to the second signal output terminal in response to a signal of the pull-down node,
wherein the pull-down node comprises a first pull-down node and a second pull-down node, and the shift register further comprises:
an input circuit, connected to an input signal terminal and a pull-up node, and transmitting a signal of the input signal terminal to the pull-up node in response to the signal of the input signal terminal;
an output circuit, connected to a clock signal terminal, the first signal output terminal, and the pull-up node, and transmitting a signal of the clock signal terminal to the first signal output terminal in response to a signal of the pull-up node.
a pull-down control circuit, connected to a third power signal terminal, a fourth power signal terminal, a fifth power signal terminal, the pull-up node, the first pull-down node, and the second pull-down node, transmitting a signal of the fifth power signal terminal to the first pull-down node and the second pull-down node in response to the signal of the pull-up node, transmitting a signal of the third power signal terminal to the first pull-down node in response to a signal of the third power signal terminal, and transmitting a signal of the fourth power signal terminal to the second pull-down node in response to a signal of the fourth power signal terminal, wherein the response to the signal of the third power signal terminal and the response to the signal of the fourth power signal terminal are occurred alternately;

a first pull-down circuit, connected to the first pull-down node, the fifth power signal terminal, the first signal output terminal, and the pull-up node, and transmitting the signal of the fifth power signal terminal to the pull-up node and the first signal output terminal in response to a signal of the first pull-down node;

a second pull-down circuit, connected to the second pull-down node, the fifth power signal terminal, the first signal output terminal, and the pull-up node, and transmitting the signal of the fifth power signal terminal to the pull-up node and the first signal output terminal in response to a signal of the second pull-down node; and a reset circuit, connected to a reset signal terminal, the pull-up node, and the fifth power signal terminal, and transmitting the signal of the fifth power signal terminal to the pull-up node in response to a signal of the reset signal terminal;

wherein a control terminal of the fifth switching is connected to the first pull-down node or the second pull-down node.

2. The shift register according to claim 1, wherein the pull-down control circuit comprises:

a first pull-down control circuit, connected to the third power signal terminal, the fifth power signal terminal, a first pull-down control node, the first pull-down node, and the pull-up node, transmitting the signal of the fifth power signal terminal to the first pull-down node and the first pull-down control node in response to the signal of the pull-up node, and transmitting the signal of the third power signal terminal to the first pull-down node and the first pull-down control node in response to the signal of the third power signal terminal; and a second pull-down control circuit, connected to the fourth power signal terminal, the fifth power signal terminal, a second pull-down control node, the second pull-down node, and the pull-up node, transmitting the signal of the fifth power signal terminal to the second pull-down node and the second pull-down control node in response to the signal of the pull-up node, and transmitting the signal of the fourth power signal terminal to the second pull-down node and the second pull-down control node in response to the signal of the fourth power signal terminal.

3. The shift register according to claim 2, wherein the first pull-down control circuit comprises:

an eighth transistor, a first terminal of the eighth transistor being connected to the third power signal terminal, a control terminal of the eighth transistor being connected to the third power signal terminal, and a second terminal of the eighth transistor being connected to the first pull-down control node;

a ninth transistor, a first terminal of the ninth transistor being connected to the third power signal terminal, a control terminal of the ninth transistor being connected to the first pull-down control node, and a second terminal of the ninth transistor being connected to the first pull-down node;

a tenth transistor, a first terminal of the tenth transistor being connected to the first pull-down control node, a second terminal of the tenth transistor being connected to the fifth power signal terminal, and a control terminal of the tenth transistor being connected to the pull-up node; and an eleventh transistor, a first terminal of the eleventh transistor being connected to the first pull-down node, a second terminal of the eleventh transistor being connected to the fifth power signal terminal, and a control terminal of the eleventh transistor being connected to the pull-up node;

the second pull-down control circuit comprises:

a twelfth transistor, a first terminal of the twelfth transistor being connected to the fourth power signal terminal, a second terminal of the twelfth transistor being connected to the second pull-down control node, and a control terminal of the twelfth transistor being connected to the fourth power signal terminal;

a thirteenth transistor, a first terminal of the thirteenth transistor being connected to the fourth power signal terminal, a second terminal of the thirteenth transistor being connected to the second pull-down node, and a control terminal of the thirteenth transistor being connected to the second pull-down control node;

a fourteenth transistor, a first terminal of the fourteenth transistor being connected to the first pull-down control node, a second terminal of the fourteenth transistor being connected to the fifth power signal terminal, and a control terminal of the fourteenth transistor being connected to the pull-up node; and a fifteenth transistor, a first terminal of the fifteenth transistor being connected to the second pull-down node, a second terminal of the fifteenth transistor being connected to the fifth power signal terminal, and a control terminal of the fifteenth transistor being connected to the pull-up node.

4. The shift register according to claim 1, wherein the first switching comprises a first transistor, a first terminal of the first transistor is connected to the first DC power signal terminal, a second terminal of the first transistor is connected to the first node, and a control terminal of the first transistor is connected to the first DC power signal terminal;

the second switching comprises a second transistor, a first terminal of the second transistor is connected to the second DC power signal terminal, a second terminal of the second transistor is connected to the first node, and a control terminal of the second transistor is connected to the first signal output terminal;

the third switching comprises a third transistor, a first terminal of the third transistor is connected to the second DC power signal terminal, a second terminal of the third transistor is connected to the second signal output terminal, and a control terminal of the third transistor is connected to the first node;

the fourth switching comprises a fourth transistor, a first terminal of the fourth transistor is connected to the first DC power signal terminal, a second terminal of the fourth transistor is connected to the second signal output terminal, and a control terminal of the fourth transistor is connected to the first DC power signal terminal; and the fifth switching comprises a fifth transistor, a first terminal of the fifth transistor is connected to the second DC power signal terminal, a second terminal of the fifth transistor is connected to the second signal output terminal, and a control terminal of the fifth transistor is connected to the pull-down node.

5. The shift register according to claim 1, wherein the input circuit comprises:

a sixth transistor, a first terminal of the sixth transistor being connected to the input signal terminal, a second terminal of the sixth transistor being connected to the pull-up node, and a control terminal of the sixth transistor being connected to the input signal terminal;

the output circuit comprises:

a seventh transistor, a first terminal of the seventh transistor being connected to the clock signal terminal, a second terminal of the seventh transistor being connected to the first signal output terminal, and a control terminal of the seventh transistor being connected to the pull-up node; and a capacitor connected between the pull-up node and the first signal output terminal.

6. The shift register according to claim 1, wherein the first pull-down circuit comprises:

a sixteenth transistor, a first terminal of the sixteenth transistor being connected to the fifth power signal terminal, a second terminal of the sixteenth transistor being connected to the pull-up node, and a control terminal of the sixteenth transistor being connected to the first pull-down node; and a seventeenth transistor, a first terminal of the seventeenth transistor being connected to the fifth power signal terminal, and a second terminal of the seventeenth transistor being connected to the first signal output terminal, and a control terminal of the seventeenth transistor being connected to the first pull-down node;

the second pull-down circuit comprises:

an eighteenth transistor, a first terminal of the eighteenth transistor being connected to the fifth power signal terminal, a second terminal of the eighteenth transistor being connected to the pull-up node, and a control terminal of the eighteenth transistor being connected to the second pull-down node; and a nineteenth transistor, a first terminal of the nineteenth transistor being connected to the fifth power signal terminal, a second terminal of the nineteenth transistor being connected to the first signal output terminal, and a control terminal of the nineteenth transistor being connected to the second pull-down node;

the reset circuit comprises:

a twentieth transistor, a first terminal of the twentieth transistor being connected to the fifth power signal terminal, a second terminal of the twentieth transistor being connected to the pull-up node, and a control terminal of the twentieth transistor being connected to the reset signal terminal.

7. A gate driving circuit, comprising a shift register comprising:

a first signal output terminal, a first switching, connected to a first DC power signal terminal and a first node, and transmitting a signal of the first DC power signal terminal to the first node in response to the signal of the first DC power signal terminal;

a second switching, connected to a second DC power signal terminal, the first signal output terminal, and the first node, and transmitting a signal of the second DC power signal terminal to the first node in response to a signal of the first signal output terminal;

a third switching, connected to the first node, the second DC power signal terminal, and a second signal output terminal, and transmitting the signal of the second DC power signal terminal to the second signal output terminal in response to a signal of the first node;

a fourth switching, connected to the first DC power signal terminal and the second signal output terminal, and transmitting the signal of the first DC power signal terminal to the second signal output terminal in response to the signal of the first DC power signal terminal;

a pull-down node; and a fifth switching, connected to the second DC power signal terminal, the second signal output terminal, and the pull-down node, and transmitting the signal of the second DC power signal terminal to the second signal output terminal in response to a signal of the pull-down node, wherein the pull-down node comprises a first pull-down node and a second pull-down node, and the shift register further comprises:

an input circuit, connected to an input signal terminal and a pull-up node, and transmitting a signal of the input signal terminal to the pull-up node in response to the signal of the input signal terminal;

an output circuit, connected to a clock signal terminal, the first signal output terminal, and the pull-up node, and transmitting a signal of the clock signal terminal to the first signal output terminal in response to a signal of the pull-up node;

a pull-down control circuit, connected to a third power signal terminal, a fourth power signal terminal, a fifth power signal terminal, the pull-up node, the first pull-down node, and the second pull-down node, transmitting a signal of the fifth power signal terminal to the first pull-down node and the second pull-down node in response to the signal of the pull-up node, transmitting a signal of the third power signal terminal to the first pull-down node in response to a signal of the third power signal terminal, and transmitting a signal of the fourth power signal terminal to the second pull-down node in response to a signal of the fourth power signal terminal, wherein the response to the signal of the third power signal terminal and the response to the signal of the fourth power signal terminal are occurred alternately;

a first pull-down circuit, connected to the first pull-down node, the fifth power signal terminal, the first signal output terminal, and the pull-up node, and transmitting the signal of the fifth power signal terminal to the pull-up node and the first signal output terminal in response to a signal of the first pull-down node;

a second pull-down circuit, connected to the second pull-down node, the fifth power signal terminal, the first signal output terminal, and the pull-up node, and transmitting the signal of the fifth power signal terminal to the pull-up node and the first signal output terminal in response to a signal of the second pull-down node; and a reset circuit, connected to a reset signal terminal, the pull-up node, and the fifth power signal terminal, and transmitting the signal of the fifth power signal terminal to the pull-up node in response to a signal of the reset signal terminal;

wherein a control terminal of the fifth switching is connected to the first pull-down node or the second pull-down node.

8. The gate driving circuit according to claim 7, wherein the pull-down control circuit comprises:

a first pull-down control circuit, connected to the third power signal terminal, the fifth power signal terminal, a first pull-down control node, the first pull-down node, and the pull-up node, and transmitting the signal of the fifth power signal terminal to the first pull-down node and the first pull-down control node in response to the signal of the pull-up node, and transmitting the signal of the third power signal terminal to the first pull-down node and the first pull-down control node in response to the signal of the third power signal terminal; and a second pull-down control circuit, connected to the fourth power signal terminal, the fifth power signal terminal, a second pull-down control node, the second pull-down node, and the pull-up node, transmitting the signal of the fifth power signal terminal to the second pull-down node and the second pull-down control node in response to the signal of the pull-up node, and transmitting the signal of the fourth power signal terminal to the second pull-down node and the second pull-down control node in response to the signal of the fourth power signal terminal.

9. The gate driving circuit according to claim 8, wherein the first pull-down control circuit comprises:

an eighth transistor, a first terminal of the eighth transistor being connected to the third power signal terminal, a control terminal of the eighth transistor being connected to the third power signal terminal, and a second terminal of the eighth transistor being connected to the first pull-down control node;

a ninth transistor, a first terminal of the ninth transistor being connected to the third power signal terminal, a control terminal of the ninth transistor being connected to the first pull-down control node, and a second terminal of the ninth transistor being connected to the first pull-down node;

a tenth transistor, a first terminal of the tenth transistor being connected to the first pull-down control node, a second terminal of the tenth transistor being connected to the fifth power signal terminal, and a control terminal of the tenth transistor being connected to the pull-up node; and an eleventh transistor, a first terminal of the eleventh transistor being connected to the first pull-down node, a second terminal of the eleventh transistor being connected to the fifth power signal terminal, and a control terminal of the eleventh transistor being connected to the pull-up node;

the second pull-down control circuit comprises:

a twelfth transistor, a first terminal of the twelfth transistor being connected to the fourth power signal terminal, a second terminal of the twelfth transistor being connected to the second pull-down control node, and a control terminal of the twelfth transistor being connected to the fourth power signal terminal;

a thirteenth transistor, a first terminal of the thirteenth transistor being connected to the fourth power signal terminal, a second terminal of the thirteenth transistor being connected to the second pull-down node, and a control terminal of the thirteenth transistor being connected to the second pull-down control node;

a fourteenth transistor, a first terminal of the fourteenth transistor being connected to the first pull-down control node, a second terminal of the fourteenth transistor being connected to the fifth power signal terminal, and a control terminal of the fourteenth transistor being connected to the pull-up node; and a fifteenth transistor, a first terminal of the fifteenth transistor being connected to the second pull-down node, a second terminal of the fifteenth transistor being connected to the fifth power signal terminal, and a control terminal of the fifteenth transistor being connected to the pull-up node.

10. The gate driving circuit according to claim 7, wherein the first switching comprises a first transistor, a first terminal of the first transistor is connected to the first DC power signal terminal, a second terminal of the first transistor is connected to the first node, and a control terminal of the first transistor is connected to the first DC power signal terminal;

the second switching comprises a second transistor, a first terminal of the second transistor is connected to the second DC power signal terminal, a second terminal of the second transistor is connected to the first node, and a control terminal of the second transistor is connected to the first signal output terminal;

the third switching comprises a third transistor, a first terminal of the third transistor is connected to the second DC power signal terminal, a second terminal of the third transistor is connected to the second signal output terminal, and a control terminal of the third transistor is connected to the first node;

the fourth switching comprises a fourth transistor, a first terminal of the fourth transistor is connected to the first DC power signal terminal, a second terminal of the fourth transistor is connected to the second signal output terminal, and a control terminal of the fourth transistor is connected to the first DC power signal terminal; and the fifth switching comprises a fifth transistor, a first terminal of the fifth transistor is connected to the second DC power signal terminal, a second terminal of the fifth transistor is connected to the second signal output terminal, and a control terminal of the fifth transistor is connected to the pull-down node.

11. The gate driving circuit according to claim 7, wherein the input circuit comprises:

a sixth transistor, a first terminal of the sixth transistor being connected to the input signal terminal, a second terminal of the sixth transistor being connected to the pull-up node, and a control terminal of the sixth transistor being connected to the input signal terminal;

the output circuit comprises:

a seventh transistor, a first terminal of the seventh transistor being connected to the clock signal terminal, a second terminal of the seventh transistor being connected to the first signal output terminal, and a control terminal of the seventh transistor being connected to the pull-up node; and a capacitor connected between the pull-up node and the first signal output terminal.

12. The gate driving circuit according to claim 7, wherein the first pull-down circuit comprises:

a sixteenth transistor, a first terminal of the sixteenth transistor being connected to the fifth power signal terminal, a second terminal of the sixteenth transistor being connected to the pull-up node, and a control terminal of the sixteenth transistor being connected to the first pull-down node; and a seventeenth transistor, a first terminal of the seventeenth transistor being connected to the fifth power signal terminal, and a second terminal of the seventeenth transistor being connected to the first signal output terminal, and a control terminal of the seventeenth transistor being connected to the first pull-down node;

the second pull-down circuit comprises:

an eighteenth transistor, a first terminal of the eighteenth transistor being connected to the fifth power signal terminal, a second terminal of the eighteenth transistor being connected to the pull-up node, and a control terminal of the eighteenth transistor being connected to the second pull-down node; and a nineteenth transistor, a first terminal of the nineteenth transistor being connected to the fifth power signal terminal, a second terminal of the nineteenth transistor being connected to the first signal output terminal, and a control terminal of the nineteenth transistor being connected to the second pull-down node;

the reset circuit comprises:

a twentieth transistor, a first terminal of the twentieth transistor being connected to the fifth power signal terminal, a second terminal of the twentieth transistor being connected to the pull-up node, and a control terminal of the twentieth transistor being connected to the reset signal terminal.

13. A display device, comprising a gate driving circuit comprising a shift register, wherein the shift register comprises:

a first signal output terminal;

a first switching, connected to a first DC power signal terminal and a first node, and transmitting a signal of the first DC power signal terminal to the first node in response to the signal of the first DC power signal terminal;

a second switching, connected to a second DC power signal terminal, the first signal output terminal, and the first node, and transmitting a signal of the second DC power signal terminal to the first node in response to a signal of the first signal output terminal;

a third switching, connected to the first node, the second DC power signal terminal, and a second signal output terminal, and transmitting the signal of the second DC power signal terminal to the second signal output terminal in response to a signal of the first node;

a fourth switching, connected to the first DC power signal terminal and the second signal output terminal, and transmitting the signal of the first DC power signal terminal to the second signal output terminal in response to the signal of the first DC power signal terminal;

a pull-down node; and a fifth switching, connected to the second DC power signal terminal, the second signal output terminal, and the pull-down node, and transmitting the signal of the second DC power signal terminal to the second signal output terminal in response to a signal of the pull-down node, wherein the pull-down node comprises a first pull-down node and a second pull-down node, and the shift register further comprises:

an input circuit, connected to an input signal terminal and a pull-up node, and transmitting a signal of the input signal terminal to the pull-up node in response to the signal of the input signal terminal;

an output circuit, connected to a clock signal terminal, the first signal output terminal, and the pull-up node, and transmitting a signal of the clock signal terminal to the first signal output terminal in response to a signal of the pull-up node;

a pull-down control circuit, connected to a third power signal terminal, a fourth power signal terminal, a fifth power signal terminal, the pull-up node, the first pull-down node, and the second pull-down node, transmitting a signal of the fifth power signal terminal to the first pull-down node and the second pull-down node in response to the signal of the pull-up node, transmitting a signal of the third power signal terminal to the first pull-down node in response to a signal of the third power signal terminal, and transmitting a signal of the fourth power signal terminal to the second pull-down node in response to a signal of the fourth power signal terminal, wherein the response to the signal of the third power signal terminal and the response to the signal of the fourth power signal terminal are occurred alternately;

a first pull-down circuit, connected to the first pull-down node, the fifth power signal terminal, the first signal output terminal, and the pull-up node, and transmitting the signal of the fifth power signal terminal to the pull-up node and the first signal output terminal in response to a signal of the first pull-down node;

a second pull-down circuit, connected to the second pull-down node, the fifth power signal terminal, the first signal output terminal, and the pull-up node, and transmitting the signal of the fifth power signal terminal to the pull-up node and the first signal output terminal in response to a signal of the second pull-down node; and a reset circuit, connected to a reset signal terminal, the pull-up node, and the fifth power signal terminal, and transmitting the signal of the fifth power signal terminal to the pull-up node in response to a signal of the reset signal terminal;

wherein a control terminal of the fifth switching is connected to the first pull-down node or the second pull-down node.

14. The display device according to claim 13, wherein the first switching comprises a first transistor, a first terminal of the first transistor is connected to the first DC power signal terminal, a second terminal of the first transistor is connected to the first node, and a control terminal of the first transistor is connected to the first DC power signal terminal;

the second switching comprises a second transistor, a first terminal of the second transistor is connected to the second DC power signal terminal, a second terminal of the second transistor is connected to the first node, and a control terminal of the second transistor is connected to the first signal output terminal;

the third switching comprises a third transistor, a first terminal of the third transistor is connected to the second DC power signal terminal, a second terminal of the third transistor is connected to the second signal output terminal, and a control terminal of the third transistor is connected to the first node;

the fourth switching comprises a fourth transistor, a first terminal of the fourth transistor is connected to the first DC power signal terminal, a second terminal of the fourth transistor is connected to the second signal output terminal, and a control terminal of the fourth transistor is connected to the first DC power signal terminal; and the fifth switching comprises a fifth transistor, a first terminal of the fifth transistor is connected to the second DC power signal terminal, a second terminal of the fifth transistor is connected to the second signal output terminal, and a control terminal of the fifth transistor is connected to the pull-down node.

* * * * *